United States Patent
Roy

(10) Patent No.: US 10,951,844 B2
(45) Date of Patent: Mar. 16, 2021

(54) TIME-OF-FLIGHT DETECTION PIXEL

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 386 days.

(21) Appl. No.: 15/953,925

(22) Filed: Apr. 16, 2018

(65) Prior Publication Data

US 2018/0302582 A1 Oct. 18, 2018

(30) Foreign Application Priority Data

Apr. 18, 2017 (FR) .................................. 1753344

(51) Int. Cl.
| | | |
|---|---|---|
| *G01C 3/08* | (2006.01) | |
| *H04N 5/369* | (2011.01) | |
| *H04N 5/378* | (2011.01) | |
| *H04N 5/353* | (2011.01) | |
| *H01L 27/146* | (2006.01) | |
| *G01S 7/4863* | (2020.01) | |

(52) U.S. Cl.
CPC ......... *H04N 5/3696* (2013.01); *G01S 7/4863* (2013.01); *H01L 27/1461* (2013.01); *H01L 27/14607* (2013.01); *H01L 27/14614* (2013.01); *H01L 27/14616* (2013.01); *H01L 27/14641* (2013.01); *H04N 5/353* (2013.01); *H04N 5/378* (2013.01); *H01L 27/1463* (2013.01); *H01L 27/14643* (2013.01)

(58) Field of Classification Search
CPC .................. G01S 7/4863; G01S 17/894; H01L 27/14641; H01L 27/14614; H01L 27/14616; H01L 27/14607; H01L 27/14643; H01L 27/1463; H04N 5/3696; H04N 5/378; H04N 5/353
USPC .......................................................... 356/5.01
See application file for complete search history.

(56) References Cited

U.S. PATENT DOCUMENTS

| | | | |
|---|---|---|---|
| 8,928,792 B1 | 1/2015 | Hynecek et al. | |
| 2011/0101241 A1* | 5/2011 | Cottier | H01L 27/14623 250/459.1 |
| 2014/0203389 A1* | 7/2014 | Neukom | H01L 27/14623 257/432 |
| 2015/0281618 A1* | 10/2015 | Saito | G01S 17/89 348/303 |
| 2017/0034464 A1* | 2/2017 | Dielacher | H04N 5/37452 |
| 2019/0181169 A1* | 6/2019 | Tadmor | G01S 7/4814 |

FOREIGN PATENT DOCUMENTS

| | | |
|---|---|---|
| EP | 3016141 A1 | 4/2016 |
| EP | 3188238 A1 | 5/2017 |

OTHER PUBLICATIONS

INPI Search Report and Written Opinion for EP 1753344 dated Mar. 12, 2018 (10 pages).

* cited by examiner

*Primary Examiner* — Mark Hellner
(74) *Attorney, Agent, or Firm* — Crowe & Dunlevy

(57) ABSTRACT

A time-of-flight detection pixel includes a photosensitive area and at least two assemblies. Each assembly includes: a charge storage area; a transfer transistor configured to control charge transfer from the photosensitive area to the charge storage area; and readout circuit configured to non-destructively measure a quantity of charges stored in the charge storage area.

28 Claims, 4 Drawing Sheets

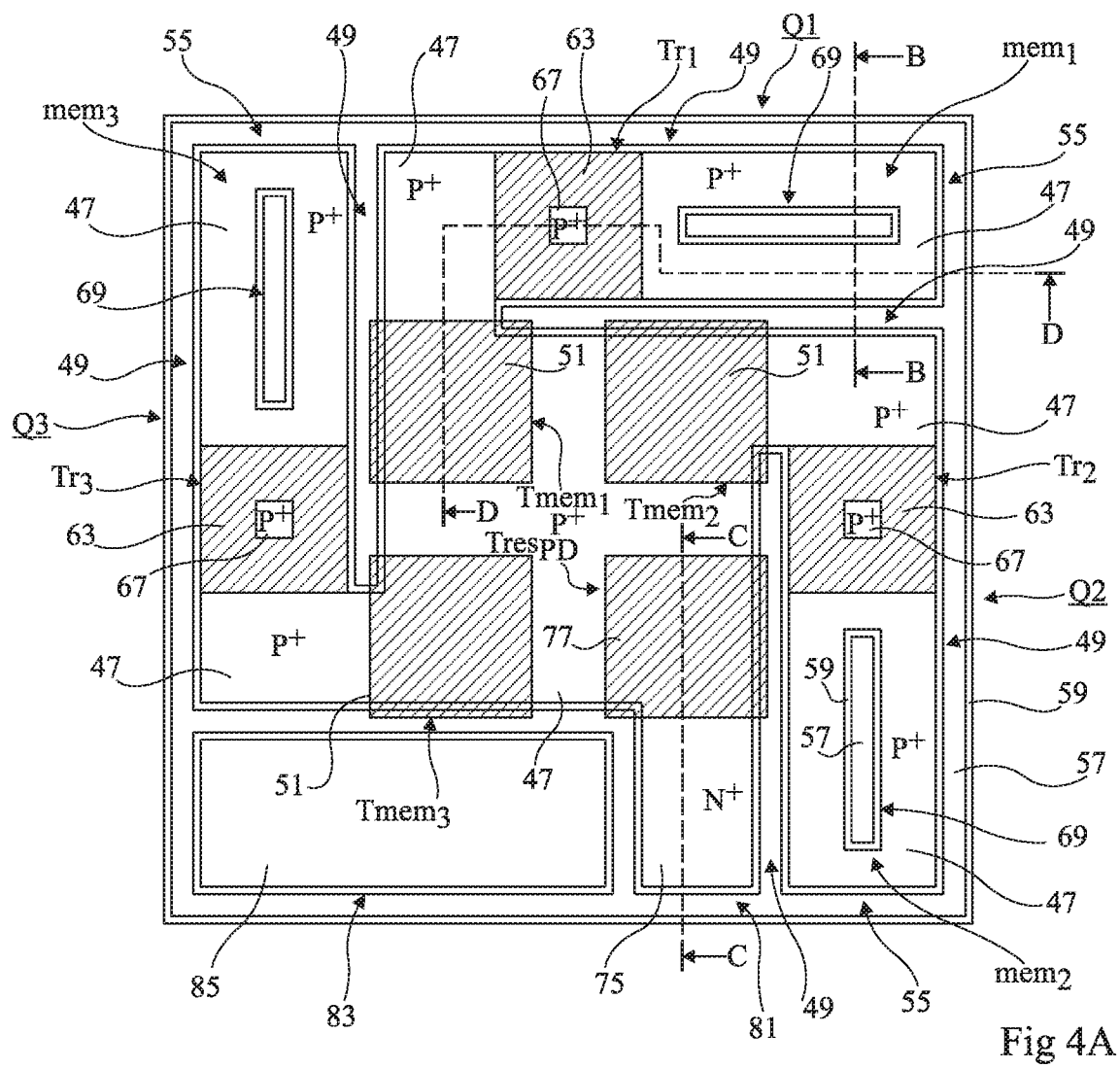
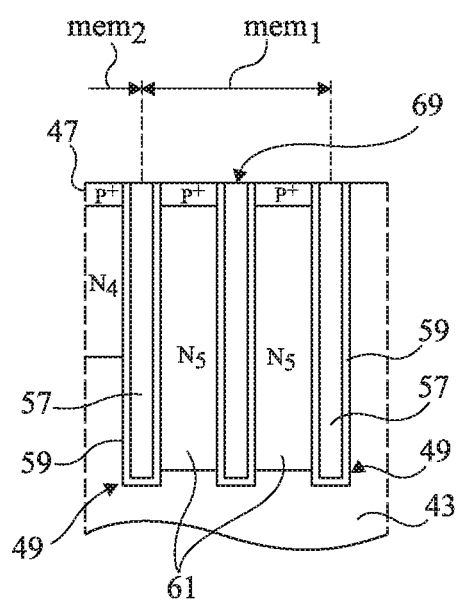
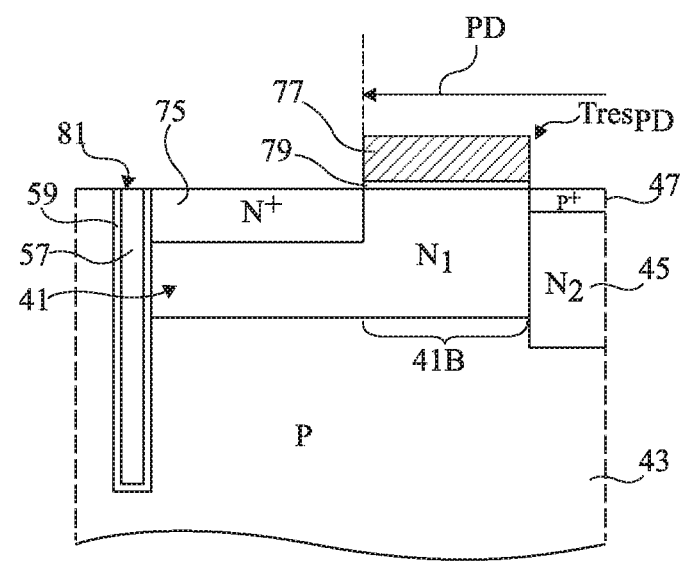
Fig 4A
Fig 4B
Fig 4C

TIME-OF-FLIGHT DETECTION PIXEL

PRIORITY CLAIM

This application claims the priority benefit of French Application for Patent No. 1753344, filed on Apr. 18, 2017, the disclosure of which is hereby incorporated by reference in its entirety to the maximum extent allowable by law.

TECHNICAL FIELD

The present disclosure relates to a distance sensor operating based on the time-of-flight (TOF) measurement principle, or TOF sensor.

BACKGROUND

In a TOF sensor, a light source emits light towards a scene. A time-of-flight detection pixel, or TOF pixel, receives the light reflected by a point of the scene conjugated with this pixel. The measurement of the time of flight, that is, of the time taken by light to travel from the light source to the point of the scene having the pixel conjugated therewith, and from this point back to the pixel, enables to calculate the distance separating the pixel from this point.

In the case where a three-dimensional image of a scene is desired to be obtained, the TOF sensor comprises an array of TOF pixels for measuring the distance separating each pixel from the point of the scene having the pixel conjugated therewith. This provides a mapping of the distances separating the sensor from the different points of the scene having the pixels conjugated therewith, and a three-dimensional image of the scene can then be reconstructed. A problem which is posed in such a sensor results from the fact that a pixel conjugated with a point of the scene close to the sensor receives more light than a pixel conjugated with a point of the scene remote from the sensor. As a result, for a given sensor illumination time (integration time), the quantity of light received by the sensor and thus the quantity of generated charges may be insufficient to determine the distance between the sensor and a point remote from the sensor. Points remote from the sensor can then be poorly distinguished in the reconstructed image.

To avoid this disadvantage, long integration times have to be provided, which is a problem, particularly in the case of the analysis of mobile objects.

It is desirable, however, to avoid providing systematically long integration times.

SUMMARY

An embodiment provides performing analyses during moderate integration times, transferring the photogenerated charges into storage areas, non-destructively reading the quantities of stored charges, and repeating the integration, transfer, and reading phases if the first reading(s) reveal insufficient quantities of stored charges. Thus, the integration time is dynamically adapted to the quantity of photogenerated charges.

More particularly, an embodiment provides a time-of-flight detection sensor comprising a plurality of pixels, each pixel comprising a photosensitive area and at least two assemblies, each comprising: a charge storage area; a transfer transistor capable of controlling charge transfers from the photosensitive area to the charge storage area; and a readout circuit capable of non-destructively measuring the quantity of charges stored in the storage area.

According to an embodiment, the readout circuit comprises: a readout transistor having its bulk corresponding to the charge storage area; a constant current source powering the readout transistor; and a circuit for measuring the voltage across the transistor.

According to an embodiment, the sensor further comprises a control circuit for repeating a charge transfer to the storage area if the quantity of transferred charges is insufficient to be measured.

According to an embodiment, each readout transistor is coupled with the current source via a selection transistor.

According to an embodiment, each storage area contains an insulated reset conductive wall.

According to an embodiment, the sensor comprises a source of emission of a periodic light signal, and a circuit configured to synchronize said source and control a potential applied to the gates of transistors of each pixel.

According to an embodiment, a pixel of the sensor comprises a semiconductor substrate and, in the pixel, the photosensitive area comprises a first doped layer of a first conductivity type; each charge storage area extends from an edge of the photosensitive area, from a first portion of the first layer coated with the gate of the corresponding transfer transistor, the charge storage area comprising a well of the first type more heavily doped than the first layer, and being laterally delimited by two vertical insulated conductive walls, parallel and opposite to each other; for each well, a ring-shaped gate coats a portion of said well and surrounds a heavily-doped area of the second type penetrating into the well and being coupled with a constant current source of the sensor; and a second doped layer of the second type coats the charge storage areas and the photosensitive area except for the portions coated with gates.

According to an embodiment, each storage area further comprises a vertical insulated reset conductive wall, arranged between said two vertical insulated conductive walls, in a portion of the well other than the portion coated with the ring-shaped gate.

According to an embodiment, each first portion of the first layer comprises a first intermediate area adjacent to the corresponding storage area, the first intermediate area being of the first doping type, more heavily doped than the rest of the first layer and less heavily doped than the well of the storage area.

According to an embodiment, each charge storage area comprises a second intermediate area, interposed between the well of the storage area and the photosensitive area, the second intermediate area being of the first doping type, more heavily doped than the first portion and less heavily doped than the well.

According to an embodiment, the photosensitive area is square-shaped in top view, and each storage area extends along an edge of the photosensitive area.

According to an embodiment, the first layer rests on a doped portion of the substrate of the second type and having its doping level which decreases as the distance to the first layer decreases.

According to an embodiment, a pixel of the sensor further comprises a reset area of the first type more heavily doped than the photosensitive area, extending from an edge of the photosensitive area, from a second portion of the first layer coated with a second gate.

According to an embodiment, the photosensitive area further comprises a charge collection area comprising a central portion arranged substantially at the center of the photosensitive area, and arms extending from this central portion, between the gates coating said portions of the first layer.

According to an embodiment, the pixel is intended to receive a periodic light signal, and the gates coating said portions of the first layer are made of materials transparent to the wavelengths of the received periodic signal.

BRIEF DESCRIPTION OF THE DRAWINGS

The foregoing and other features and advantages will be discussed in detail in the following non-limiting description of specific embodiments in connection with the accompanying drawings, wherein:

FIGS. 4A to 4D schematically show an embodiment of the TOF pixel of FIG. 2; and

DETAILED DESCRIPTION

Figure 1:
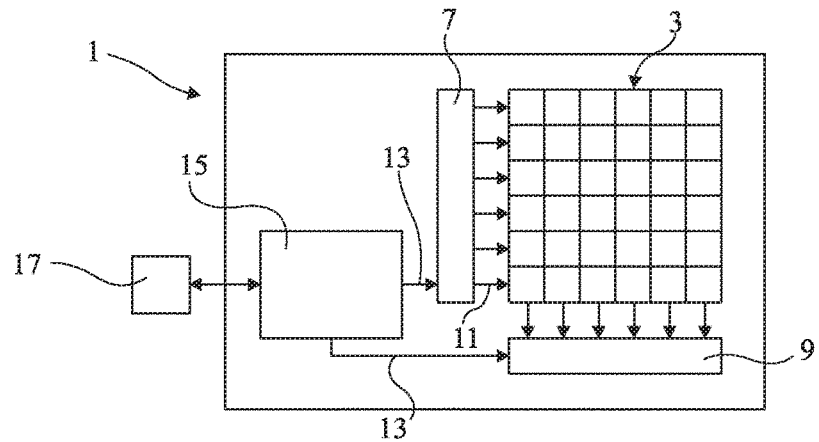
FIG. 1 is a top view schematically showing an example of a TOF sensor.

The same elements have been designated with the same reference numerals in the various drawings and, further, the various drawings are not to scale. For clarity, only those steps and elements which are useful to the understanding of the described embodiments have been shown and are detailed.

In the following description, terms "above", "under", "top", "upper", "lower", "vertical", etc. refer to the orientation of the concerned elements in the corresponding drawings. Unless otherwise specified, expressions "substantially" and "approximately" mean to within 10%, preferably to within 5%.

FIG. 1 is a simplified top view of an example of a TOF sensor. Sensor 1 comprises an array 3 of TOF pixels, for example, an array of 1,000 rows by 1,000 columns. Array 3 is associated with a row decoder 7 and with a column decoder 9. Row decoder 7 delivers signals 11 enabling to select one or the other of the array rows. Column decoder 9 enables to read the information from the pixels of a selected row. Row decoder 7 and column decoder 9 are controlled by signals 13 delivered by a control and processing circuit 15. Control and processing circuit 15, for example, comprises a processor associated with one or a plurality of memories. Sensor 1 is associated with a light source 17, for example, a laser, for illuminating a scene for which a three-dimensional image is desired to be obtained. Light source 17 is connected to the control and processing circuit 15 to synchronize the control signals applied to the TOF pixels of array 3 and light source 17.

In the following description, the case of a sensor 1 where light source 17 emits a sinusoidal signal $L_E$ having a frequency which may be in the range from 20 to 160 MHz, for example, 25 MHz, is considered. For each pixel, phase-shift $\varphi$ between the emitted light signal $L_E$ and the received light signal $L_R$ is determined. The distance separating the pixel from its conjugate point is then determined based on phase shift $\varphi$.

Figure 2:
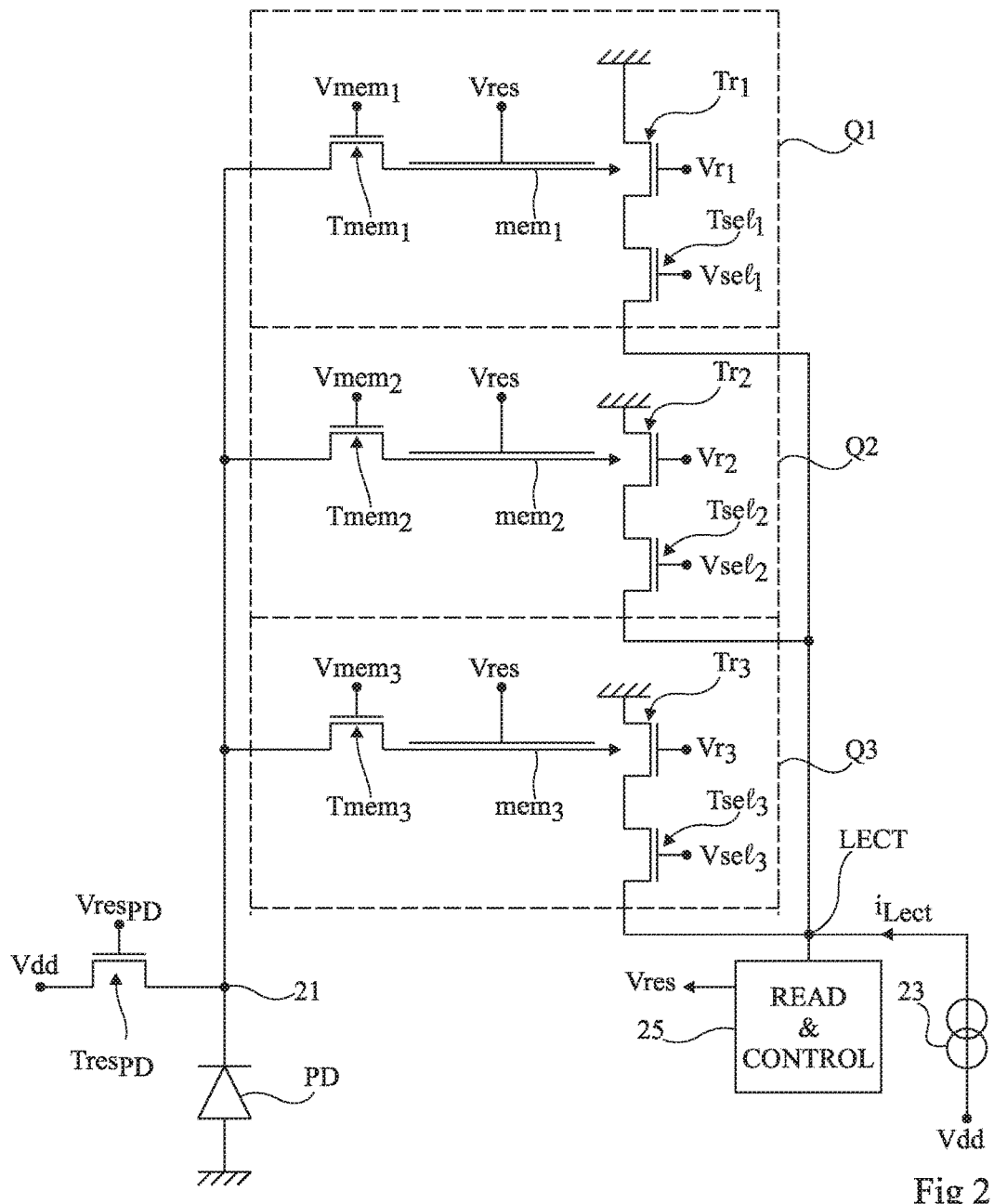
FIG. 2 shows an embodiment of a TOF pixel circuit.

FIG. 2 shows an embodiment in the form of a TOF pixel circuit.

The TOF pixel comprises a photosensitive element such as a photodiode PD having a terminal connected to a node 21 and having its other terminal connected to a power supply rail set to a low reference potential, for example, the ground. Node 21 is coupled to a sense node LECT via three identical transfer, storage, and readout assemblies $Q_1$, $Q_2$, and $Q_3$ in parallel. Each assembly $Q_i$, with i equal to 1, 2, or 3 in this example, comprises a transfer N-channel MOS transistor, $Tmem_i$, a charge storage area $mem_i$, a P-channel MOS readout transistor, $Tr_i$, and a P-channel MOS selection transistor $Tsel_i$. Transistors $Tr_i$ and $Tsel_i$ are series-connected. The drain of transistor $Tr_i$ is connected to a power supply rail set to the low potential, and the source of transistor $Tr_i$ is connected to the drain of transistor $Tsel_i$, transistor $Tr_i$ being controlled by a signal $Vr_i$. The source of transistor $Tsel_i$ is connected to sense node LECT, transistor $Tsel_i$ being controlled by a signal $Vsel_i$. The source of transistor $Tmem_i$ is connected to node 21 of the photosensitive element, and the drain of transistor $Tmem_i$ is coupled to storage area $mem_i$, transistor $Tmem_i$ being controlled by a signal $Vmem_i$ applied to its gate. The bulk region of transistor $Tr_i$ corresponds to a portion at least of storage area $mem_i$. Storage area $mem_i$ further comprises a terminal of application of a reset signal Vres.

The threshold voltage of readout transistor $Tr_i$ depends on the quantity of charges injected into the charge storage area. The determination of this threshold voltage thus forms a way to non-destructively measure this quantity of charges.

The TOF pixel further comprises an N-channel MOS transistor, $Tres_{PD}$, for resetting photosensitive element PD. The source of transistor $Tres_{PD}$ is connected to node 21 and the drain of transistor $Tres_{PD}$ is connected to a power supply rail set to a high reference potential, for example, power supply potential Vdd. Transistor $Tres_{PD}$ is controlled by a signal $Vres_{PD}$ applied to its gate.

To determine phase shift $\varphi$ between an emitted light signal $L_E$ and a received light signal $L_R$, signal $L_R$ is sampled by transferring, successively and at regular intervals, charges photogenerated in photosensitive element PD towards storage areas $mem_1$, and then $mem_2$, and finally $mem_3$, such transfers being controlled by the corresponding transistors $Tmem_i$. The total duration to perform the three successive transfers is equal to a period of signals $L_E$ and $L_R$ and the three successive transfers are repeated a determined number of times, for example, from 1,000 to 100,000 times. Each area of charge transfer from photosensitive area PD to an area $mem_i$ causes a modification of the potential in this area $mem_i$. Due to the fact that the bulk of readout transistor $Tr_i$ is included in the corresponding storage area $mem_i$, this potential modification causes a modification of the threshold voltage of the transistor. Thus, a phase of reading the charges accumulated in the storage area comprises measuring the threshold voltages of transistors $Tr_i$. Advantageously, such a reading of the charges accumulated in the memory areas is not destructive. It is thus possible to repeat the integration, transfer, and readout operations until a measurable charge is transferred into the charge storage area.

The sense node is coupled to a read and control circuit (READ & CONTROL) 25, which particularly controls reset signals Vres of the storage areas according to the read signals.

Figure 3:
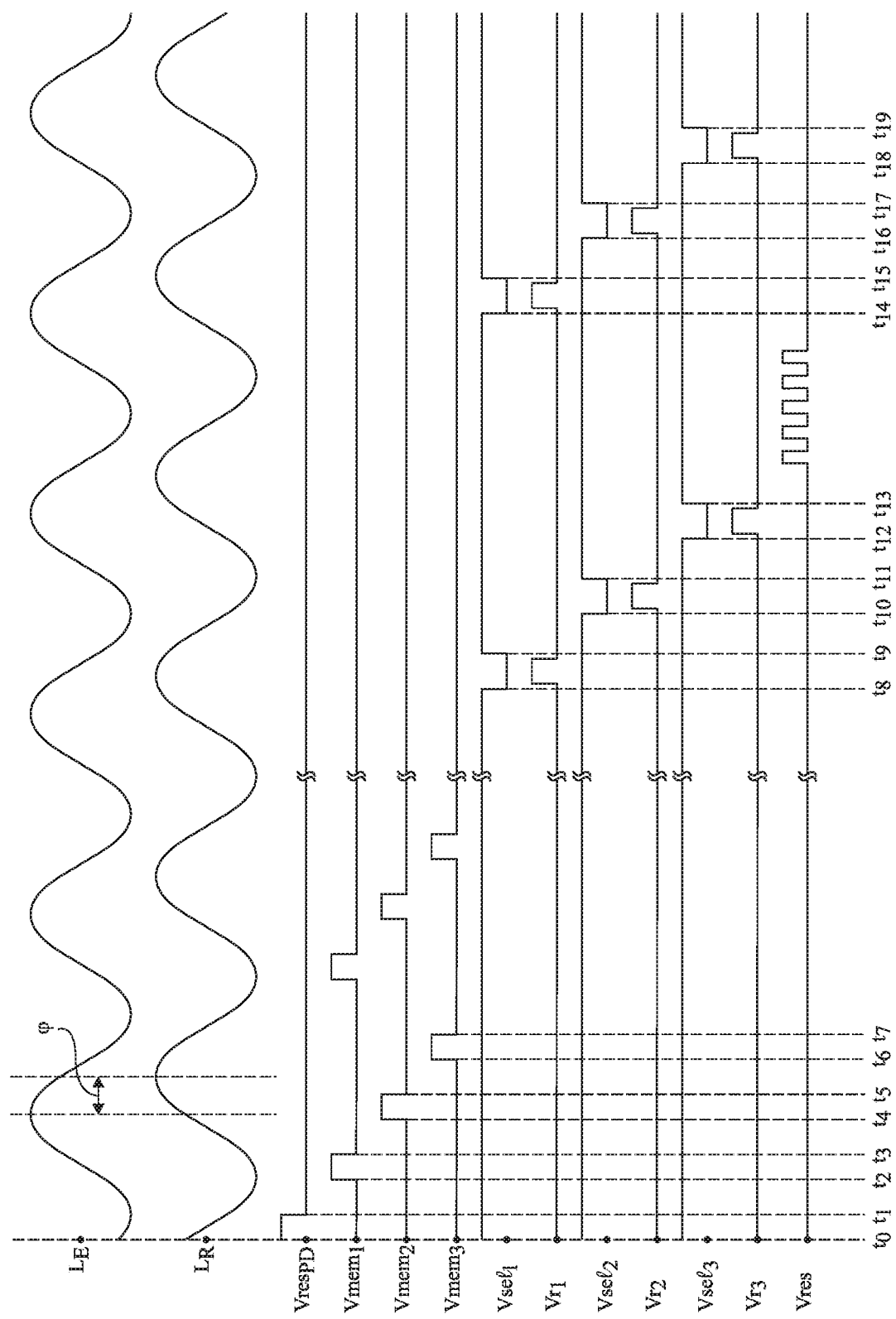
FIG. 3 is a timing diagram illustrating an embodiment of the pixel of FIG. 2.

FIG. 3 shows timing diagrams of light signal $L_E$ emitted by light source 17 associated with sensor 1, of light signal $L_R$ received by the TOF pixel, and of digital signals $Vres_{PD}$, $Vmem_i$, $Vsel_i$, $Vr_i$, and Vres during an integration phase and during a readout phase, at successive times $t_0$ to $t_{19}$.

In operation, by default, signals $Vres_{PD}$, $Vmem_i$, and Vres are at a low level and signals $Vsel_i$ are at a high level so that transistors $Tres_{PD}$, $Tmem_i$, Tres, and $Tsel_i$ are in the off state. Due to the fact that transistors $Tsel_i$ are in the off state, the source of each transistor $Tr_i$ is disconnected from sense node LECT, and, by default, signals $Vr_i$ may be set to a low level such that the corresponding transistors $Tr_i$ are in the on state.

A resetting of photosensitive element PD is first performed by setting transistor $Tres_{PD}$ to the on state between times $t_0$ and $t_1$. At time $t_1$, transistor $Tres_{PD}$ is set back to the off state and a pixel integration phase, synchronized on signal $L_E$, can start. As an example, signal $Vres_{PD}$ is at a 2-V potential in the on state, and at a -1-V potential in the off state.

During the integration phase, the electrons photogenerated in photosensitive element PD are transferred to storage areas $mem_i$. To achieve this, transfer transistors $Tmem_i$ are set to the on state, each in turn between respective times $t_2$ and $t_3$, $t_4$ and $t_5$, and $t_6$ and $t_7$. These three transfers are then repeated a determined number of times.

From time $t_8$ corresponding to the end of the integration phase and to the beginning of a readout phase, a non-destructive reading of the electrons accumulated in each of storage areas $mem_i$ is performed.

A reading of storage areas $mem_i$ is performed as follows, successively for each assembly $Q_i$. Selection transistor $Tsel_i$ is set to the on state to couple the source of the corresponding transistor $Tr_i$ to sense node LECT. While transistor $Tsel_i$ is in the on state, signal $Vr_i$, initially in the low state, for example, at the ground potential, is set to the high state. As shown in FIG. 2, a current source 23, connected between node LECT and power supply rail Vdd, then supplies a current $i_{Lect}$, for example, of 1 µA, which flows between the source and the drain of transistor $Tr_i$. Due to the fact that a determined current flows through the transistor and that its gate and drain voltages are fixed, the source voltage can only take a single value which depends on the transistor threshold voltage, and thus on the quantity of charges accumulated in the corresponding area $mem_i$. A first potential $V_i$ having its value depending on the threshold voltage of transistor $Tr_i$ is then measured at node LECT. First potential $V_i$ is stored, for example, by read and control circuit 25. Signal $Vr_i$ applied to the gate of transistor $Tr_i$ is set back to the low state and transistor $Tsel_i$ is set back to the off state. More particularly, in the example of FIG. 3, transistor $Tsel_1$ is set to the on state from time $t_8$ to time $t_9$, transistor $Tsel_2$ is set to the on state from time $t_{10}$ to time $t_{11}$, and transistor $Tsel_3$ is set to the on state from time $t_{12}$ to time $t_{13}$.

A phase of resetting storage areas $mem_i$ is then carried out if the quantities of stored charges are sufficient. In this embodiment, the phase of resetting areas $mem_i$ is carried out, between times $t_{13}$ and $t_{14}$, by switching a plurality of times signal Vres between its low state and its high state. A second reading from the storage areas may then be performed to implement a correlated double sampling (CDS) of each storage area to remove part of the noise, as well known by those skilled in the art. In the shown example, the second reading from storage area $mem_1$, $mem_2$, $mem_3$ is respectively carried out between times $t_{14}$ and $t_{15}$, $t_{16}$ and $t_{17}$, and $t_{18}$ and $t_{19}$.

After the first reading of areas $mem_i$ of a pixel, the sum of the first potentials $V_i$ is calculated, for example, by read and control circuit 25. This sum enables to roughly estimate the quantity of light received by the pixel during the previous integration phase. It is then possible to know, before the resetting of storage areas $mem_i$, whether this quantity of light is sufficient for the point in the scene conjugated with this pixel to be distinguished in the reconstructed image. For this purpose, the sum of the first potentials $V_i$ is for example compared with a predetermined threshold by read and control circuit 25. In the case where the quantity of light received by a pixel is not sufficient, the integration phase is resumed and continued, preferably after photosensitive element PD has been set to zero. As an example, the integration phase is extended by a time period corresponding to its initial duration. Due to the fact that the first reading of areas $mem_i$ is not destructive, the electrons accumulated during the initial integration phase are still present in areas $mem_i$ and the electrons transferred to these areas $mem_i$ during the extension of the integration phase add to the electrons already present. Once the extended integration phase is over, a new phase of reading the pixel is implemented, as described in relation with FIG. 3. Of course, as long as the quantity of light received by the pixel is not sufficient, the integration phase may be extended again as described hereabove.

Thus, in a TOF sensor comprising pixels of the type of that in FIG. 2, the duration of the integration phase may be dynamically adjusted for each pixel of the sensor according to the light received by the pixel. Such a dynamic adaptation of the duration of the integration phase for each sensor pixel is made possible due to the fact that the reading of storage areas of the pixel $mem_i$ is not destructive.

An embodiment of a pixel of the type in FIG. 2 will now be described in further detail in relation with FIGS. 4A to 4D.

Figure 4D:
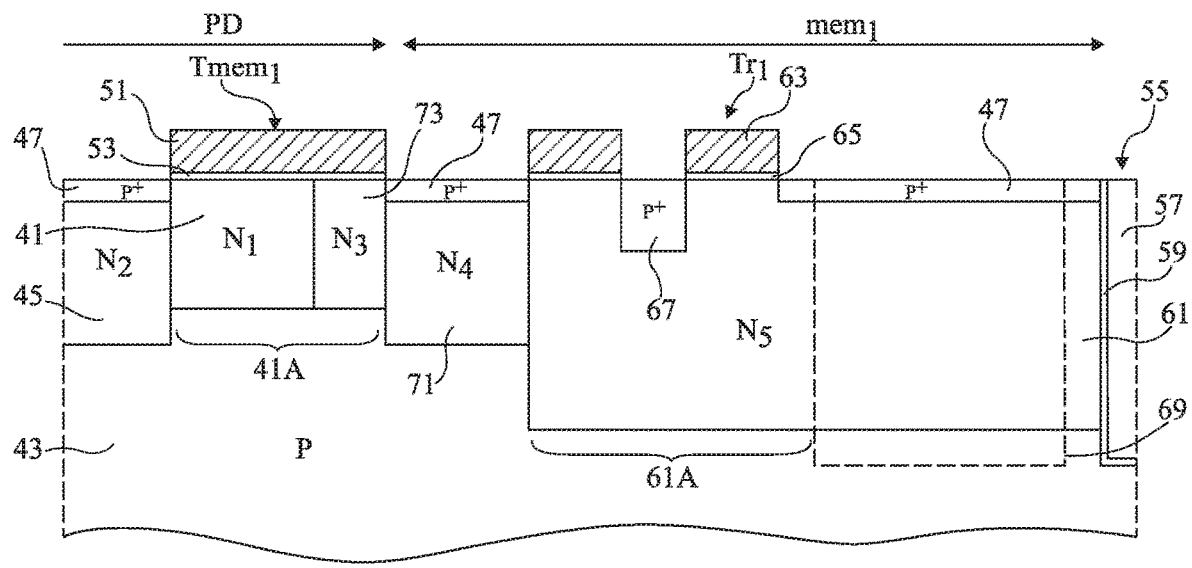

FIGS. 4A to 4D schematically show an embodiment of the TOF pixel of FIG. 2. FIG. 4A is a top view of the pixel, FIGS. 4B and 4C are cross-section views respectively along planes BB and CC of FIG. 4A, and FIG. 4D is a cross-section view along broken line DD of FIG. 4A. In this embodiment, the TOF pixel comprises three assemblies $Q_i$, with i equal to 1, 2, or 3, and one reset transistor $Tres_{PD}$. Each assembly $Q_i$ comprises a transfer transistor $Tmem_i$, a storage area $mem_i$, and a readout transistor $Tr_i$.

The TOF pixel comprises a photosensitive area PD, for example, having a square shape in top view. As illustrated in FIGS. 4C and 4D, photosensitive area PD comprises an N-type doped layer 41, having a doping level $N_1$. $N_1$ layer 41 is formed at the upper surface of a P-type doped semiconductor substrate 43 having a doping level which may decrease as the distance to $N_1$ layer 41 decreases.

As illustrated in FIG. 4C, the TOF pixel also comprises, in photosensitive area PD, an N-type doped charge collection area 45, having a doping level $N_2$ greater than $N_1$. $N_2$ layer 45 is coated with a heavily-doped P-type layer 47 ($P^+$). $N_2$ layer 45 extends through all or part of the thickness of $N_1$ layer 41. In this example, $N_2$ charge collection area 45 penetrates into P substrate 43 deeper than $N_1$ layer 41.

As illustrated in FIGS. 4A, 4B, and 4D, each storage area $mem_i$ is delimited by an insulated conductive wall (or insulated vertical electrode) 49. More particularly, each storage area $mem_i$ extends from a portion 41A of layer 41 entirely coated with gate 51 of the corresponding transfer transistor $Tmem_i$. Gate 51 is separated from $N_1$ portion 41A by a gate insulator layer 53. In this embodiment, as illustrated in FIG. 4A, each storage area $mem_i$ extends along an edge of photosensitive area PD, and electrode 49 delimiting area $mem_i$ on the side of photosensitive area PD also delimits this edge of photosensitive area PD. Further, the electrodes 49 laterally delimiting each storage area $mem_i$ are connected to each other by an electrode 55 corresponding to an extension of electrodes 49. Electrode 55 laterally delimits storage area mem$_i$ on the side opposite to the corresponding portion 41A.

As illustrated in FIGS. 4B and 4C, insulated walls 49, 55 extend from the upper surface of the pixel, cross N$_1$ layer 41, and penetrate into P substrate 43. Walls 49, 55 comprise a conductive material 57, for example, doped polysilicon, bordered with an insulating layer 59, for example, made of silicon oxide.

Each storage area mem$_i$ comprises, as illustrated in FIGS. 4B and 4D, an N-type doped well 61, having a doping level N$_5$ greater than that of N$_1$ layer 41. Each N$_5$ well 61 penetrates into substrate 43 down to a depth greater than or equal to that of N$_1$ layer 41 and smaller than that of insulated electrodes 49, 55. Each N$_5$ well 61 comprises a portion 61A coated with gate 63 of the corresponding readout transistor Tr$_i$, gate 63 being separated from well 61 by a gate insulator layer 65. Gate 63 is a ring-shaped gate surrounding a heavily-doped P$^+$-type area 67 and penetrating down to a portion of the thickness of N$_5$ well 61. Ring-shaped gate 63 preferably extends from one to the other of walls 49 laterally delimiting the corresponding storage area mem$_i$. In this example, portion 61A of N$_5$ well 61 is on the side of portion 41A of N$_1$ layer 41, as shown in FIG. 4D. Each area mem$_i$ is coated with P$^+$ layer 47 except for portion 61A of N$_5$ well 61 coated with ring-shaped gate 63. For each transistor Tr$_i$, area 67 forms the source region of the transistor, P$^+$ layer 47 around gate 61 of the transistor forms the drain region of the transistor, and well 61 forms the bulk region of the transistor.

Each storage area mem$_i$ comprises an insulated vertical electrode or wall 69 arranged in the corresponding N$_5$ well 61, beyond portion 61A. Electrode 69 is made of the same materials and penetrates into the substrate down to the same depth as electrodes 49 and 55. In this embodiment, the electrode is parallel to electrodes 49 delimiting area mem$_i$ and is arranged at an equal distance from each of electrodes 49. In FIG. 4D, the electrode is not visible but its contours have been shown in dotted lines. Electrode 69 is an electrode for resetting area mem$_i$.

As illustrated in FIG. 4D, each area mem$_i$ further comprises an N-type doped area 71, having a doping level N$_4$ greater than N$_1$ and smaller than N$_5$, area 71 being adjacent to portion 41A Each N$_4$ area 71 penetrates into P substrate 43, for example, down to a depth greater than or equal to that of N$_1$ layer 41 and smaller than or equal to that of N$_5$ wells 61. In the shown example, area 71 is interposed between portion 41A and N$_5$ well 61 with which it is in contact. As a variation, area 71 may be formed in N$_5$ well 61, which then extends all the way to N$_1$ portion 41A. Still as a variation, area 71 may be omitted and, in this case, N$_5$ well 61 comes into contact with N$_1$ portion 41A.

Each N$_1$ portion 41A comprises an area 73 having a doping level N$_3$ greater than N$_1$ and smaller than N$_4$, N$_5$, and N$_2$. Area 73 is coated with gate 51 of the corresponding transistor Tmem$_i$, and is adjacent to a corresponding storage area mem$_i$. N$_3$ areas 73 penetrate into P substrate 43, for example, down to a depth substantially equal to that of N$_1$ layer 41. As a variation, N$_1$ portion 41A may comprise no N$_3$ area 73.

As shown in FIG. 4D, from N$_2$ charge collection area 45 and all the way to an electrode 55, there successively extend, in contact two by two, N$_2$ charge collection area 45, an N$_1$ portion 41A, an N$_3$ area 73, an N$_4$ area 71, and an N$_5$ well 61.

Reset transistor Tres$_{PD}$ of the TOF pixel comprises, as shown in FIG. 4C, a heavily-doped N-type drain area 75 (N$^+$) extending from an edge of photosensitive area PD, preferably an edge from which no storage area mem$_i$ extends. N$^+$ drain area 75 more particularly extends from a portion 41B of N$_1$ layer 41 totally coated with gate 77 of transistor Tres$_{PD}$, gate 77 being separated from N$_1$ portion 41B of photosensitive area PD by a gate insulator layer 79. N$^+$ drain area 75 is for example formed in N$_1$ layer 41, outside of photosensitive area PD.

In a top view illustrated by FIG. 4A, N$^+$ drain area 75 extends lengthwise from area PD to an insulated vertical electrode 75 extends lengthwise from area PD to an insulated vertical electrode 81 aligned with electrode 55 of a neighboring area mem$_i$, area mem$_2$ in the shown example, and widthwise between an electrode 49 delimiting this neighboring area mem$_i$ and a portion of a ring-shaped insulated vertical electrode 83. Electrodes 81 and 83 are made of the same materials and penetrate into the substrate down to the same depth as electrodes 49, 55, and 69. Ring-shaped electrode 83 delimits a rectangular region 85 extending along the edge of photosensitive area PD from which drain area 75 extends. Transistors, not shown, for example transistors Tsel$_i$, may be formed in region 85. The dimensions and the layout of areas mem$_i$, of drain area 75, and of region 85 are preferably selected so that the pixel is square-shaped in top view as illustrated in FIG. 4A. In practice, as illustrated in FIG. 4A, walls 49, 55, 81, and 83 are portions of a same wall, which entirely delimits the pixel periphery, where portions of this wall may be shared by a plurality of adjacent pixels.

As shown in FIG. 4A, charge collection area 45 has the shape of a cross comprising a central portion arranged at the center of the photosensitive area, and arms extending from this central portion, between gates 51, 77 resting on photosensitive area. The thicknesses and the materials of the gates of transistors Tmem$_i$ and Tres$_{PD}$ may then be selected so that these gates are transparent to the radiations of the light signal L$_R$ received by the pixel. Further, such thicknesses and materials may be selected so that the gates filter at least part of the parasitic light radiations having wavelengths distant from those of signal L$_R$.

A screen opaque to light (not shown) comprising an opening opposite photosensitive area PD is provided above the pixel. Thus, the radiations of light signal L$_R$ only reach photosensitive area PD of the pixel.

In operation, electrodes 49, 55, 81, and 85 are connected to a negative or zero potential, for example, −1 V so that holes are stored along their walls. This enables to decrease dark currents. This also enables to set P$^+$ layer 47 and P substrate 43 to a same low reference potential, for example, the ground, applied to substrate 43 or to layer 47. By default, signal Vres applied to conductive material 57 of electrodes 69 is in the low state corresponding to a negative or zero potential, for example, the same potential as that applied to the other insulated vertical electrodes of the pixel. As a result of the biasing of the vertical insulated electrodes, photosensitive area PD and storage areas mem$_i$ then correspond to so-called "pinned" diodes. The doping levels of photosensitive area PD and of storage areas mem$_i$ are selected so that, in the absence of illumination, the pinned diodes are fully depleted.

A phase of transfer between photosensitive area PD and an area mem$_i$ will now be described in further detail in relation with FIGS. 5a to 5C.

Figure 5A:
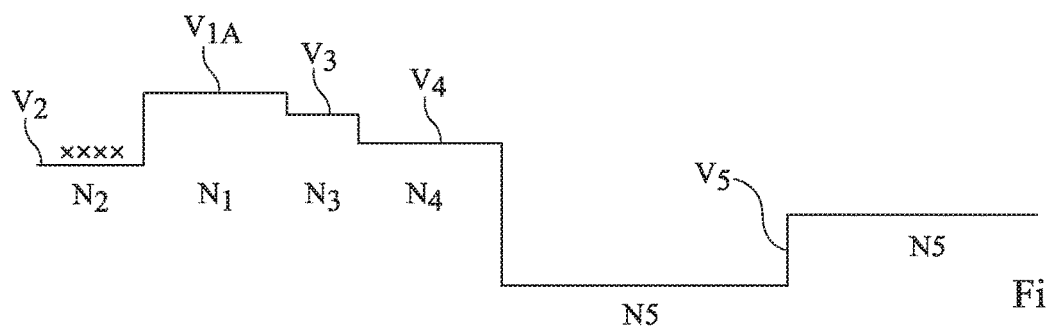
FIGS. 5A to 5C schematically illustrate the variation of the electrostatic potentials in various regions of the pixel of FIGS. 4A to 4D during a charge transfer step.
Figure 5B:
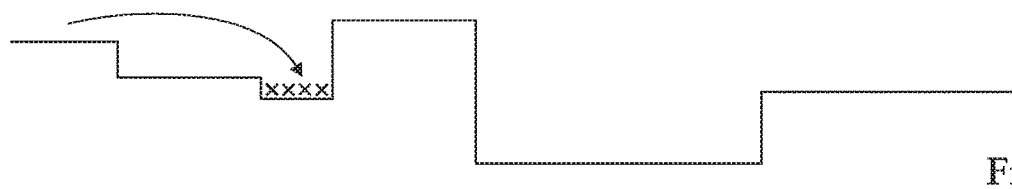
Figure 5C:
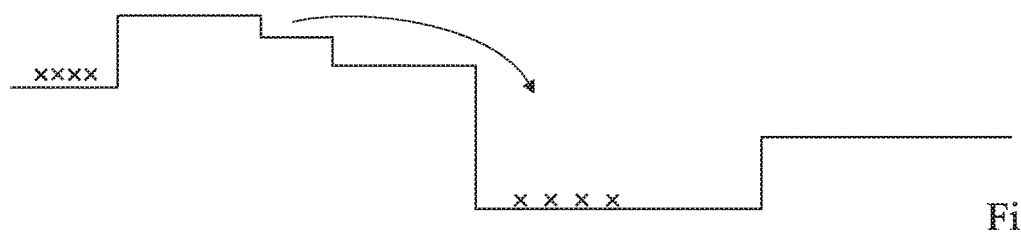

FIGS. 5A to 5C schematically show the variation of the levels of the electrostatic potentials along broken line DD of FIG. 4A, according to the on or off state of the corresponding transistor Tmem$_i$. FIGS. 5A to 5C are drawn at the same horizontal scale as FIG. 4D. In these drawings, the electrostatic potentials are increasing from top to bottom.

For control signals $Vmem_i$ in the low state (for example, at ground), due to the fact that doping levels $N_1$, $N_3$, $N_4$, $N_5$ are increasing, electrostatic potentials V1A, V3, V4, V5 respectively in portion 41A, $N_3$ area 73, $N_4$ area 71, and $N_5$ well 61, are increasing. Further, due to the fact that doping level $N_2$ is greater than levels $N_1$ and $N_3$, electrostatic potential V2 in the charge collection area is greater than electrostatic potentials V1A and V3.

In $N_5$ well 61, the greater the distance from the walls of electrodes 49, 55, and 69 where the electrostatic potential is low and set by the holes accumulated along these walls, the higher the electrostatic potential. As a result, $N_5$ well 61 has a lower potential level in the portion of the well where reset electrode 69 is formed than in portion 61A. Thus, the electrons which are transferred from photosensitive area PD first accumulate in portion 61A. As a result, even the transfer of a small quantity of electrons into area $mem_i$ causes a modification of the threshold voltage of the corresponding transistor $Tr_i$. Reset electrode 69 thus advantageously enables to increase the pixel sensitivity.

At the step of FIG. 5A, transistor $Tmem_i$ is in the off state. The potential of signal $Vmem_i$ in the low state is selected so that potentials V1A and V3 remain smaller than potentials V2 and V4. Although this has not been shown in the drawings, signal $Vres_{PD}$ is in the low state and at the same potential as signals $Vmem_i$, whereby the electrostatic potential in $N_1$ portion 41B (see FIG. 4C) under gate 77 of transistor $Tres_{PD}$ is the same as potential V1A in $N_1$ portions 41A under gates 51 of transistors $Tmem_i$. Thus, the photogenerated electrons remain confined in area $N_2$.

At the step of FIG. 5B, transistor $Tmem_i$ is set to the on state so that potential V1A and potential V3 become greater than potentials V2 and V4. As a result, the electrons stored in $N_2$ charge collection area 45 are all transferred to $N_3$ area 73, where they are temporarily stored, blocked between potential barriers V1A and V4. The electrons (not shown) which have already been transferred into storage area $mem_i$ during previous transfers remain confined in $N_5$ well by potential barrier V4.

At the step of FIG. 5C, transistor $Tmem_i$ is set back to the off state, whereby potentials V1A and V3 become smaller than potentials V4 (and V5) again. The electrons which were in $N_3$ area 73 are then all transferred to the corresponding $N_5$ well 61, through $N_4$ area 71. Advantageously, potential V1A forms a potential barrier preventing electrons from returning from $N_3$ area 71 to $N_2$ charge collection area 45.

A phase of resetting areas $mem_i$ comprising a plurality of successive operations of switching signal Vres between a negative potential and a positive potential has been previously described in relation with FIG. 3. In the pixel of FIGS. 4A to 4D, the signal is applied to the conductive material of reset electrodes 69. Then, as a result of these successive switching operations, the electrons accumulated in areas $mem_i$ recombine along the walls of electrodes 69, and are discharged from areas $mem_i$ to P+ layer 47 and/or P substrate 43.

Advantageously, the provision of a reset electrode 69 in well 61 of area $mem_i$ enables to avoid for the resetting of area $mem_i$ to be performed by applying a very high potential to gate 51 of transistor $Tr_i$, for example, more than 5 V. Reset electrode 69 also enables to avoid a resetting of area $mem_i$ by applying signal Vres to electrodes 49, which would modify the behavior of photosensitive area PD of the pixel and/or influence adjacent pixels sharing portions of these electrodes 49.

Another advantage of the above-described embodiments is that, by default, each transistor $Tr_i$ is in the on state, which results in an accumulation of holes under its gate 63. The hole accumulation, between P+ layer 47 and the corresponding area 67 is then at the same potential as layer 47 and enables to decrease dark currents, particularly during integration phases.

In the embodiment described hereabove in relation with FIGS. 4A to 4D, each area $mem_i$ only comprises a single reset electrode 69, arranged between the corresponding electrodes 49, in parallel therewith and at an equal distance from each of electrodes 49. It is within the abilities of those skilled in the art to modify the number and/or the arrangement of the reset electrodes in the storage area according to the shape of the electrostatic potential well that it desires to obtain in this area $mem_i$. Preferably, as described hereabove, it will be within the abilities of those skilled in the art to select a number and/or a layout of reset electrodes which enable to obtain a deeper potential well under the gate of the corresponding transistor $Tr_i$.

Specific embodiments have been described. Various alterations, modifications, an improvements will occur to those skilled in the art. In particular, substrate 43 may be N-type doped, at a doping level smaller than $N_1$, and it can then have a doping level increasing up to $N_1$ layer 41.

Similarly to what has been described for $N_1$ portions 41A, $N_1$ portion 41B of transistor $Tres_{PD}$ may comprise an $N_3$ area 73 adjacent to N+ area 75 to improve the charge transfer controlled by transistor $Tres_{PD}$.

As previously indicated, the number of assemblies $Q_i$ may be selected to be greater than 3, possibly by providing for the photosensitive area to have the shape of a polygon, for example, a regular polygon, other than a square. For example, in a pixel comprising five assemblies $Q_i$ and one reset transistor $Tres_{PD}$, photosensitive area PD for example has a substantially hexagonal shape. It may also be provided for each pixel to only comprise two assemblies $Q_i$, which is sufficient to calculate phase shift φ.

More generally, the shape, the number, and the layout of the various elements forming the TOF pixel described in relation with FIGS. 4A to 4D may be modified. It may for example be provided for each storage area $mem_i$, rather than extending along an edge of photosensitive area PD, to extend orthogonally to this edge.

Although conductivity types have been described for the various areas, layers, and wells of a pixel in the case where the accumulated, collected, transferred, stored, and read charges are electrons, these conductivity types may all be inverted so that the charges can be holes. It will be within the abilities of those skilled in the art to adapt the control potentials applied to the various transistors of the pixel.

An embodiment where transistor $Tres_{PD}$ is only used as a transistor for resetting the photosensitive area has been described hereabove. It is within the abilities of those skilled in the art to modify the potential applied to the gate of transistor $Tres_{PD}$ in the off state so that an excess of electrons photogenerated in photosensitive area PD is discharged into N+ region 71 rather than towards a storage area $mem_i$, transistor $Tres_{PD}$ being then used as an anti-dazzle transistor in addition to being used as a transistor for resetting photosensitive area PD.

Various embodiments with various variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A time-of-flight detection sensor comprising a plurality of pixels, wherein each pixel comprises a photosensitive area and at least two circuit assemblies, and wherein each circuit assembly comprises:
   a charge storage area;
   a transfer transistor configured to control charge transfers from the photosensitive area to the charge storage area; and
   a readout circuit configured to provide for non-destructively measuring a quantity of charge stored in the charge storage area;
   wherein the readout circuit comprises:
      a readout transistor having a source, a drain, a gate coupled to receive a control signal and a bulk, wherein the charge storage area provides the bulk of the readout transistor;
      a constant current source configured to power a source-drain path of the readout transistor; and
      a circuit for measuring a voltage across the readout transistor.

2. The sensor of claim 1, wherein the source-drain path of each readout transistor is coupled in series with the constant current source via a source-drain path of a selection transistor.

3. The sensor of claim 1, further comprising a control circuit configured to repeat a charge transfer to the charge storage area if a quantity of charge transferred is insufficient to be measured.

4. The sensor of claim 1, wherein the charge storage area includes an insulated conductive reset wall.

5. The sensor of claim 1, further comprising a source of emission of a periodic light signal, and a synchronizing circuit configured to synchronize said source of emission and operation of each pixel.

6. A time-of-flight detection sensor comprising a plurality of pixels, wherein each pixel comprises a photosensitive area and at least two circuit assemblies, and wherein each circuit assembly comprises:
   a charge storage area;
   a transfer transistor configured to control charge transfers from the photosensitive area to the charge storage area; and
   a readout circuit configured to provide for non-destructively measuring a quantity of charge stored in the charge storage area;
   wherein each pixel comprises:
      a semiconductor substrate including a first doped layer of a first conductivity type forming the photosensitive area;
      wherein the charge storage area extends from an edge of the photosensitive area, from a first portion of the first doped layer coated with a gate of the transfer transistor;
      wherein the charge storage area comprises a well of the first conductivity type more heavily doped than the first doped layer, and being laterally delimited by two vertical insulated conductive walls positioned parallel and opposite to each other;
      a ring-shaped gate coating a portion of said well and surrounding a heavily-doped area of a second conductivity type penetrating into the well and being coupled to a constant current source; and
      a second doped layer of the second conductivity type coating the charge storage area and the photosensitive area except for portions that are coated with the ring-shaped gate.

7. The sensor of claim 6, wherein the charge storage area further comprises a vertical insulated reset conductive wall arranged between said two vertical insulated conductive walls in a portion of the well other than the portions that are coated with the ring-shaped gate.

8. The sensor of claim 6, wherein each first portion of the first doped layer comprises a first intermediate area adjacent to the charge storage area, the first intermediate area being of the first conductivity type, more heavily doped than the rest of the first doped layer and less heavily doped than the well of the charge storage area.

9. The sensor of claim 6, wherein the charge storage area further comprises a second intermediate area, interposed between the well of the charge storage area and the photosensitive area, the second intermediate area being of the first conductivity type, more heavily doped than the first portion and less heavily doped than the well.

10. The sensor of claim 6, wherein the photosensitive area is square-shaped in top view, and the charge storage area extends along an edge of the photosensitive area.

11. The sensor of claim 6, wherein the first doped layer rests on a portion of the semiconductor substrate of the second conductivity type and having a doping level which decreases as a distance to the first doped layer decreases.

12. The sensor of claim 6, further comprising a reset area of the first conductivity type more heavily doped than the photosensitive area, extending from an edge of the photosensitive area, from a second portion of the first doped layer coated with a second gate.

13. The sensor of claim 6, wherein the photosensitive area further comprises a charge collection area comprising a central portion arranged substantially at a center of the photosensitive area, and further including arms extending from said central portion, between the gates coating said portions of the first doped layer.

14. The sensor of claim 6, further comprising a source of emission of a periodic light signal, and wherein the gate coating said portion of the first doped layer is made of a material transparent to wavelengths of the periodic light signal.

15. A time-of-flight detection pixel, comprising:
   a semiconductor substrate including a photosensitive area that comprises a first doped layer of a first conductivity type;
   a charge storage area extending from an edge of the photosensitive area from a first portion of the first doped layer coated with a gate of a transfer transistor, the charge storage area comprising a well of the first conductivity type more heavily doped than the first doped layer, and being laterally delimited by two vertical insulated conductive walls that are located parallel and opposite to each other;
   a ring-shaped gate coating a portion of said well and surrounding a heavily-doped area of a second conductivity type penetrating into the well and configured to receive a constant current; and a second doped layer of the second conductivity type coating the charge storage area and the photosensitive area except for portions coated with the ring-shaped gate.

16. The pixel of claim 15, wherein the charge storage area further comprises a vertical insulated reset conductive wall, arranged between said two vertical insulated conductive walls, in a portion of the well other than the portions coated with the ring-shaped gate.

17. The pixel of claim 15, wherein each first portion of the first doped layer comprises a first intermediate area adjacent to the charge storage area, the first intermediate area being of the first conductivity type, more heavily doped than a rest of the first doped layer and less heavily doped than the well of the charge storage area.

18. The pixel of claim 15, wherein the charge storage area comprises a second intermediate area, interposed between the well of the charge storage area and the photosensitive area, the second intermediate area being of the first conductivity type, more heavily doped than the first portion and less heavily doped than the well.

19. The pixel of claim 15, wherein the photosensitive area is square-shaped in top view, and the charge storage area extends along an edge of the photosensitive area.

20. The pixel of claim 15, wherein the first doped layer rests on a portion of the semiconductor substrate of the second conductivity type and having a doping level which decreases as a distance to the first doped layer decreases.

21. The pixel of claim 15, further comprising a reset area of the first conductivity type more heavily doped than the photosensitive area, extending from an edge of the photosensitive area, from a second portion of the first doped layer that is coated with a second gate.

22. The pixel of claim 15, wherein the photosensitive area further comprises a charge collection area comprising a central portion arranged substantially at a center of the photosensitive area, and one or more arms extending from the central portion, between the gates coating said portions of the first doped layer.

23. The pixel of claim 15, wherein the gates coating said portions of the first doped layer are made of materials transparent to wavelengths of a signal received by said pixel.

24. The sensor of claim 6, wherein the readout circuit comprises:
 a readout transistor having a bulk that forms the charge storage area;
 a constant current source configured to power the readout transistor; and
 a circuit for measuring a voltage across the transistor.

25. The sensor of claim 24, wherein each readout transistor is coupled in series with the constant current source via a selection transistor.

26. The sensor of claim 6, further comprising a control circuit configured to repeat a charge transfer to the charge storage area if a quantity of charge transferred is insufficient to be measured.

27. The sensor of claim 6, wherein the charge storage area includes an insulated conductive reset wall.

28. The sensor of claim 6, further comprising a source of emission of a periodic light signal, and a synchronizing circuit configured to synchronize said source of emission and operation of each pixel.

* * * * *